United States Patent
Lee et al.

(10) Patent No.: US 8,384,131 B2
(45) Date of Patent: Feb. 26, 2013

(54) SEMICONDUCTOR DEVICE AND METHODS OF FORMING THE SAME

(75) Inventors: Kyoung-Woo Lee, Suwon-si (KR); Andrew Tae Kim, Yongin-si (KR); Hong-Jae Shin, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1111 days.

(21) Appl. No.: 12/187,271

(22) Filed: Aug. 6, 2008

(65) Prior Publication Data

US 2009/0039480 A1  Feb. 12, 2009

(30) Foreign Application Priority Data

Aug. 7, 2007  (KR) .................. 10-2007-0079098

(51) Int. Cl.
*H01L 27/10* (2006.01)

(52) U.S. Cl. ................. 257/209; 257/529; 257/E23.147; 257/E23.149

(58) Field of Classification Search .................. 257/530, 257/209, 529, 538, E23.147, E23.149; 438/601
See application file for complete search history.

(56) References Cited

U.S. PATENT DOCUMENTS

| | | | |
|---|---|---|---|
| 5,882,998 A | | 3/1999 | Sur, Jr. et al. |
| 6,020,641 A | * | 2/2000 | Lee et al. .................. 257/755 |
| 2005/0110070 A1 | * | 5/2005 | Omura ........................ 257/311 |
| 2007/0045783 A1 | | 3/2007 | Ohkubo et al. |
| 2007/0090486 A1 | * | 4/2007 | Otsuka et al. ................ 257/529 |
| 2008/0150076 A1 | * | 6/2008 | Nam et al. .................... 257/529 |

FOREIGN PATENT DOCUMENTS

| | | | |
|---|---|---|---|
| JP | 2007-88435 | | 4/2007 |
| KR | 2006011475 A | * | 2/2006 |
| KR | 10-0652418 | | 11/2006 |

* cited by examiner

*Primary Examiner* — Hoai V Pham
(74) *Attorney, Agent, or Firm* — F. Chau & Associates, LLC

(57) ABSTRACT

The semiconductor device includes a fuse structure disposed on a substrate. An interlayer dielectric disposed on the fuse structure. A first contact plug, a second contact plug, and a third contact plug penetrate the interlayer dielectric and wherein each of the first contact plug, the second contact plug and the third contact plug are connected to the fuse structure. A first conductive pattern and a second conductive pattern are disposed on the interlayer dielectric. The first conductive pattern and the second conductive pattern are electrically connected to the first contact plug and second contact plug, respectively.

21 Claims, 14 Drawing Sheets

US 8,384,131 B2

SEMICONDUCTOR DEVICE AND METHODS OF FORMING THE SAME

PRIORITY STATEMENT

This application claims priority under 35 U.S.C §119 to Korean Patent Application No. 10-2007-0079098, filed on Aug. 7, 2007, the entire disclosure of which is hereby incorporated by reference herein in its entirety.

TECHNICAL FIELD

The present disclosure relates to semiconductor devices, more particularly, the present disclosure is directed to a semiconductor device and methods of forming the same.

BACKGROUND OF THE INVENTION

Semiconductor chips may typically be sorted into either good or defective chips by running an electrical test. The defective chip usually contains failed cells which may cause the malfunctioning of the chip. Therefore, the failed cell should be replaced by a redundant cell, through a repair process.

A fuse is generally used for the repair process. A fuse corresponding to the defective cell may be cut off, and a fuse corresponding to the redundant cell may be connected so that the defective cell may be replaced with the redundant cell. However, if the fuse is cut incompletely, the defective cell may not be repaired.

Therefore, an effective cutting of the fuse may be required to repair the defective cells successfully.

SUMMARY OF THE INVENTION

Exemplary embodiments of the present invention are related to a semiconductor device and methods of forming the same. In accordance with an exemplary embodiment of the present invention, a semiconductor device is provided. The semiconductor device includes a fuse structure disposed on a substrate, an interlayer dielectric disposed on the fuse structure a first contact plug, a second contact plug, and a third contact plug penetrating the interlayer dielectric and wherein each of the first contact plug, the second contact plug and the third contact plug are connected to the fuse structure. The semiconductor device further includes a first conductive pattern and a second conductive pattern disposed on the interlayer dielectric. The first conductive pattern and the second conductive pattern are electrically connected to the first contact plug and the second contact plug, respectively.

In accordance with another exemplary embodiment of the present invention, a method of forming a semiconductor device is provided. The method includes forming a fuse structure on a substrate, forming an interlayer dielectric on the fuse structure, etching the interlayer dielectric to form a first contact hole, a second contact hole, and a third contact hole that expose the fuse structure, forming a first contact plug, a second contact plug, and a third contact plug in the first contact hole, second contact hole, and third contact hole, respectively and wherein each of the first contact plug, the second contact plug and the third contact plug are connected to the fuse structure. The method further includes forming a first conductive pattern and a second conductive pattern on the interlayer dielectric. The first conductive pattern and the second conductive pattern are electrically connected to the first contact plug and the second contact plug, respectively.

BRIEF DESCRIPTION OF THE DRAWINGS

Exemplary embodiments of the present invention.

DETAILED DESCRIPTION OF THE EXEMPLARY EMBODIMENTS OF THE INVENTION

Figure 1:
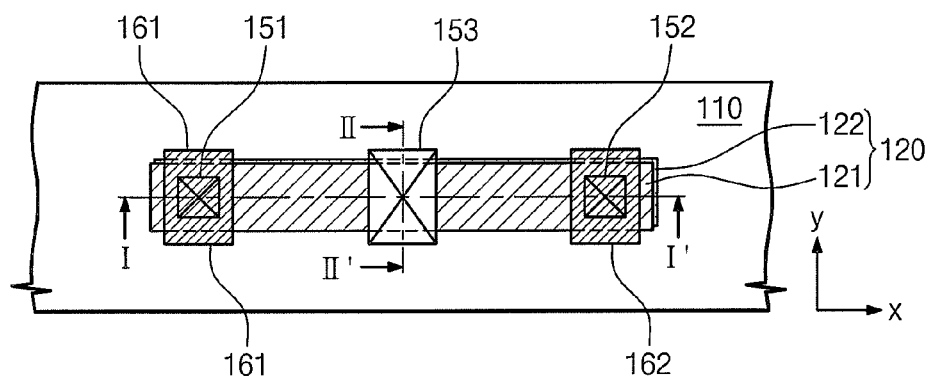
FIG. 1 is a plan view illustrating a semiconductor device and a method of forming the same according to an exemplary embodiment of the present invention.

The present invention will now be described more fully hereinafter with reference to the accompanying drawings, in which exemplary embodiments of the invention are shown. This invention, however, may be embodied in many different forms and should not be construed as being limited to the exemplary embodiments set forth herein. Any element in a claim that does not explicitly state "means for" performing a specified function, or "step for" performing a specific function, is not to be interpreted as a "means" or "step" clause as specified in 35 U.S.C. §112, paragraph 6. In particular, the use of "step of" in the claim herein is not intended to invoke the provisions of 35 U.S.C. §112, paragraph 6. In the drawings, the thicknesses of layers and regions are exaggerated for clarity. It will also be understood that when a layer is referred to as being "on" another layer or substrate, it can be directly Referring to FIGS. 1 to 4, a semiconductor device and a method of forming the same will be described, according to an exemplary embodiment of the present invention.

Figure 2:
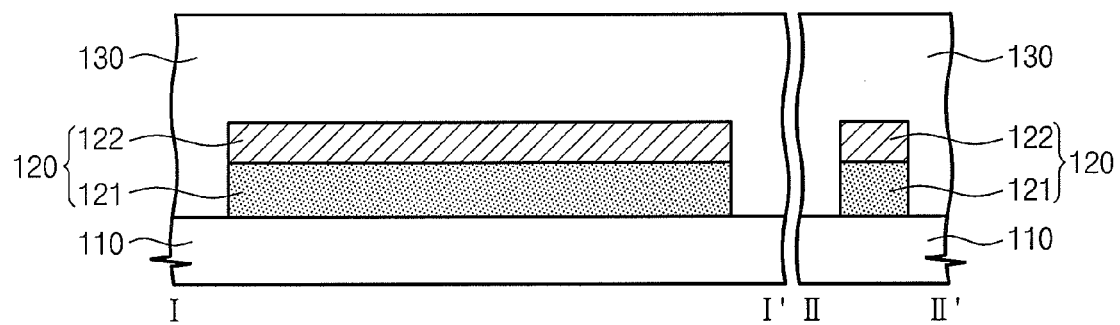
FIGS. 2 to 4 are cross-sectional views cut along line I-I' and line II-II' of FIG. 1.

Referring to FIG. 1 and FIG. 2, a fuse structure 120 is formed in a substrate 110. The fuse structure 120 may be mounted on an insulation layer formed in the substrate 110, or may be elongated to a first direction x. The fuse structure 120 may include a lower semiconductor layer 121 and an upper metal semiconductor compound layer 122. In other words, the fuse structure 120 may be formed by stacking a respective semiconductor layer 121 and a metal semiconductor compound layer 122. For example, the semiconductor layer 121 may include polysilicon, and the metal semiconductor compound layer 122 may include a metal silicide. The metal silicide may be made by, for example, forming a metal layer on the polysilicon then performing an annealing process. The metal silicide may include, for example, cobalt silicide and/or nickel silicide. An interlayer dielectric 130 which includes the fuse structure 120 is formed in the substrate 110. For example, the interlayer dielectric 130 may include a silicon oxide material obtained by a chemical vapor deposition (CVD) process.

Figure 3:
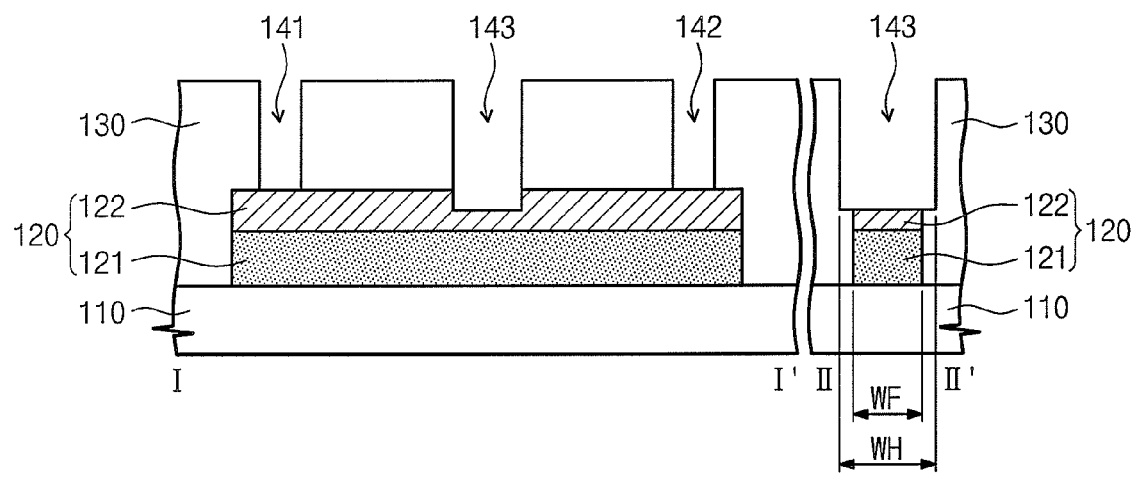

Referring to FIG. 1 and FIG. 3, the interlayer dielectric 130 is etched to form a first, second, and third contact holes 141, 142, and 143 so that they expose the fuse structure 130. The first to third contact holes 141, 142, and 143 may be formed simultaneously or sequentially. For example, the third contact hole 143 may be formed after the first and second contact holes 141 and 142 are made.

The first to third contact holes 141, 142, and 143 are arrayed in the order of the first contact hole 141, the third contact hole 143 and the second contact hole 142, respectively. In other words, the third contact hole 143 may be formed between the first contact hole 141 and the second contact hole 142. In this way, the first and second contact holes 141 and 142 can expose both ends of the fuse structure 120, and the third contact hole 143 can expose the center portion of the fuse structure 120. From the second direction y, the width of the third contact hole 143 (WH) may be larger than the width of the fuse structure 120 (WF).

The step of forming the third contact hole 143 may include the step of etching the interlayer dielectric 130 and the step of etching the fuse structure 120. Equivalent etching conditions (e.g. etch gas) or different etching conditions may be used for etching the interlayer dielectric 130 and etching the fuse structure 120. Also, the etching of the fuse structure 120 may be done by over-etching the interlayer dielectric 130. As a result, a portion of the fuse structure 120 is recessed, and the bottom surface of the third contact hole 143 comes at a deeper level than the top surface of the fuse structure 120. For example, the bottom surface of the third contact hole 143 may be at a level between the bottom surface and the top surface of the metal semiconductor compound layer 122. The metal semiconductor compound layer 122 has a decreased thickness at a portion in contact with the bottom surface of the third contact hole 143. Accordingly, the fuse structure 120 also has a decreased thickness at the portion in contact with the bottom surface of the third contact hole 143. In the case where the first to third contact holes 141, 142 and 143 are formed simultaneously, a portion of the metal semiconductor compound layer 122 at the first and second contact holes 141 and 142 may be recessed. In the case where the first to third contact holes 141, 142 and 143 are formed sequentially, a separate mask may be used for etching the fuse structure 120 to make the third contact hole 143.

Figure 4:
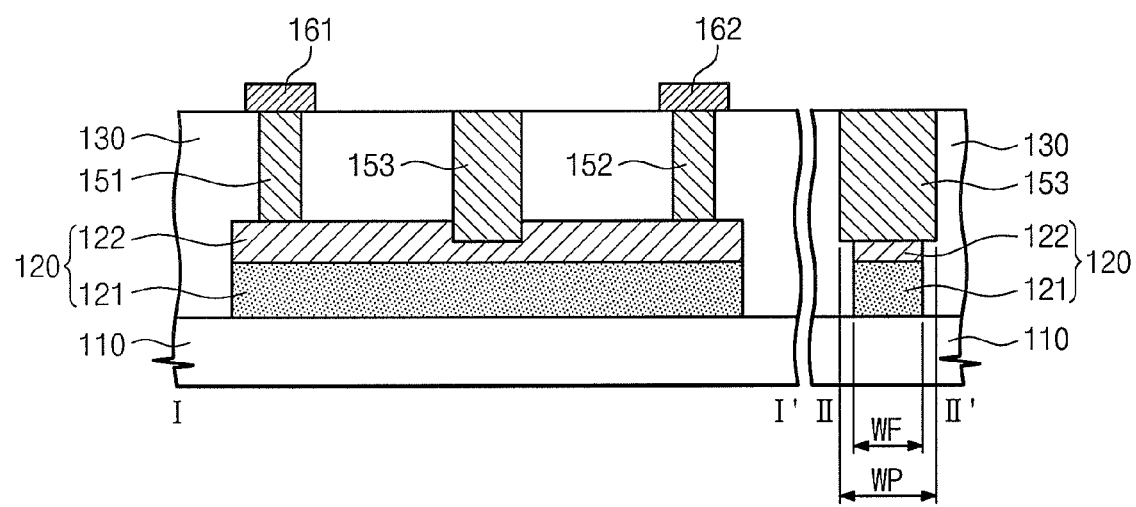

Referring to FIG. 1 and FIG. 4, a first contact plug 151, a second contact plug 152, and a dummy contact plug 153 are formed in the first to third contact holes 141, 142 and 143, respectively, to be connected to the fuse structure 120. The dummy contact plug 153 is formed between the first and the second contact plugs 151 and 152. In other words, the first and the second contact plugs 151 and 152 are disposed at both ends of the fuse structure 120, and the dummy contact plug 153 is disposed at the center portion of the fuse structure 120.

The first and the second contact plugs 151 and 152 and the dummy contact plug 153 may be formed simultaneously. For example, the first and the second contact plugs 151 and 152 and the dummy contact plug 153 may be formed by forming a conductive layer on the interlayer dielectric 130 including the first to third contact holes 141, 142 and 143 and then performing a planarization process to expose a top surface of the interlayer dielectric 130. For example, the first and the second contact plugs 151 and 152 and the dummy contact plug 153 may include tungsten. Alternatively, a barrier metal layer may be further formed along an internal surface of the first to third contact holes 141, 142 and 143, before the first and the second contact plugs 151 and 152 and the dummy contact plug 153 are formed. For example, the barrier metal layer may include titanium (Ti) and/or titanium nitride (TiN). In the second direction y, the thickness of the width WP of the dummy contact plug 153 may be larger than the width WF of the fuse structure 120.

The bottom surface of the dummy contact plug 153 is at a lower level than the top surface of the fuse structure 120. For example, the bottom surface of the dummy contact plug 153 may be at a level between the bottom surface and the top surface of the metal semiconductor compound layer 122. The metal semiconductor compound layer 122 has a decreased thickness at a portion in contact with the bottom surface of the dummy contact plug 153. Accordingly, the fuse structure 120 also has a decreased thickness at the portion in contact with the bottom surface of the dummy contact plug 153.

A first and a second conductive patterns 161 and 162 are formed and are connected to the first and second contact plugs 151 and 152 on the interlayer dielectric 130, respectively. The first and second conductive patterns 161 and 162 may be metal lines or metal pads.

When an electrical signal is supplied to the first conductive pattern 161 and/or second conductive pattern 162, electrical current flows through the first and second conductive patterns 161 and 162. Electrons are transferred in the opposite direction to the electric current flow. For example, when a first signal voltage is supplied to the first conductive pattern 161, and a second signal voltage higher than the first signal voltage is supplied to the second conductive pattern 162, the current flows in a direction and path of: the second conductive pattern 162→second contact plug 152→the metal semiconductor compound of the fuse structure 122→first contact plug 151→first conductive pattern 161. Electrons move in the opposite direction of the current flow, which is in a direction and path of: first conductive pattern 161→first contact plug 151→the metal semiconductor compound of the fuse structure 122→second contact plug 152→the second conductive pattern 162. Among the area of the metal semiconductor compound layer 122 in contact with the dummy contact plug 153, at an area near the second conductive pattern 162 (or the second contact plug 152) in which the higher signal voltage is supplied, the electromigration corresponding to the current flow is increased, thereby enabling the metal semiconductor compound layer 122 to be cut off more rapidly. For example, the metal semiconductor compound layer 122 can be cut off more rapidly in an area where the cross-sectional area of the metal semiconductor compound layer 122 is decreased.

Referring to FIGS. 5 to 8, another semiconductor device and method of forming the same will be described according to a second exemplary embodiment of the present invention.

Figure 5:
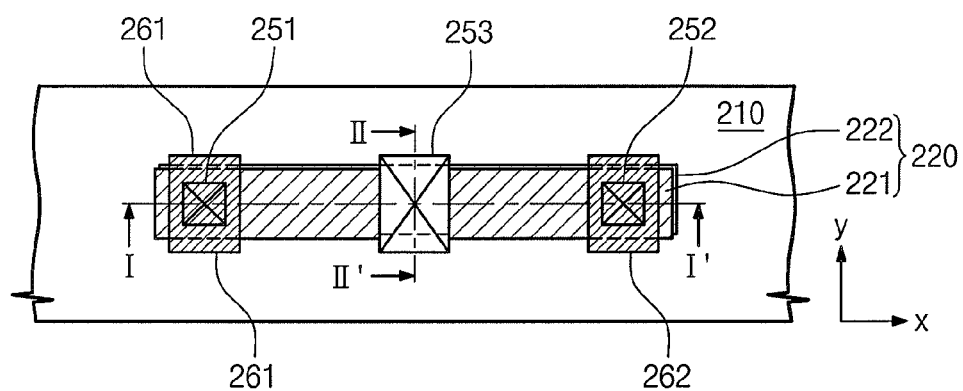
FIG. 5 is a plan view illustrating a semiconductor device and a method of forming the same according to an exemplary embodiment of the present invention.
Figure 6:
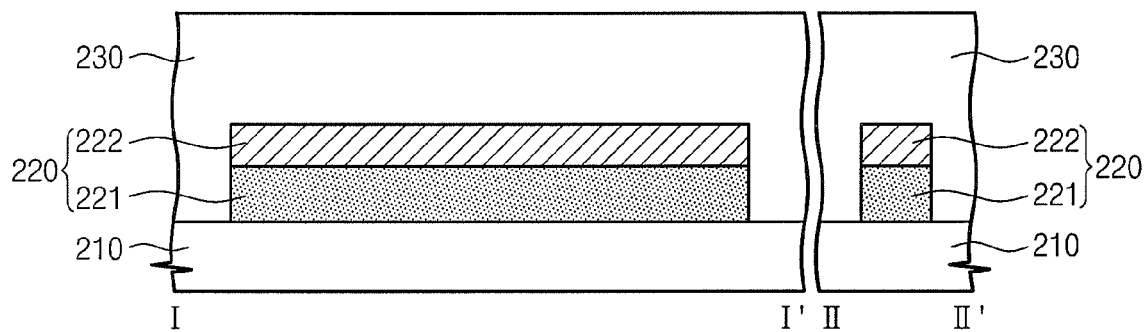
FIGS. 6 to 8 are cross-sectional views cut along line I-I' and line II-II' of FIG. 5.

Referring to FIG. 5 and FIG. 6, a fuse structure 220 is formed in a substrate 210. The fuse structure 220 may be formed on an insulation layer formed in the substrate 210, and may be elongated to the first direction x. The fuse structure 220 may include a lower semiconductor layer 221 and an upper metal semiconductor compound layer 222. In other words, the fuse structure 220 may be formed by stacking a respective semiconductor layer 221 and a metal semiconductor compound layer 222. For example, the semiconductor layer 221 may include polysilicon, and the metal semiconductor compound layer 222 may include a metal silicide. The metal silicide may be made by, for example, forming a metal layer on the polysilicon and then performing an annealing process. The metal silicide may include, for example, cobalt silicide and/or nickel silicide. An interlayer dielectric 230 which includes the fuse structure 220 is formed in the substrate 210. For example, the interlayer dielectric 230 may include a silicon oxide material obtained by a chemical vapor deposition (CVD) process.

Figure 7:
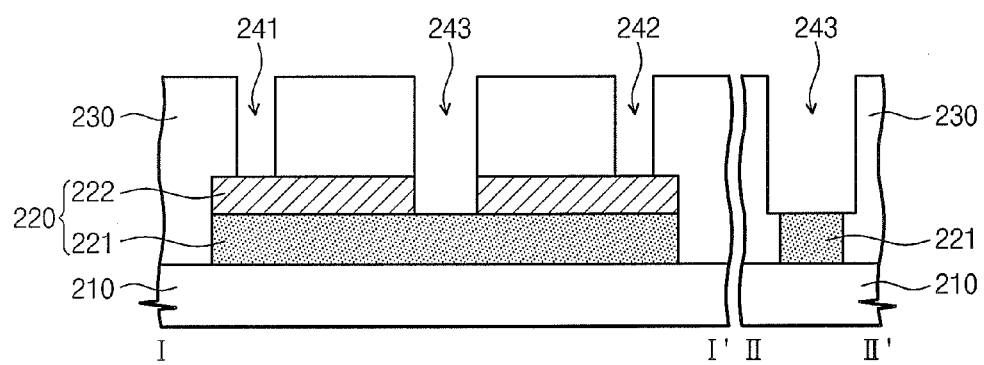

Referring to FIG. 5 and FIG. 7, the interlayer dielectric 230 is etched to form a first, second, and third contact holes 241, 242, and 243 so that they expose the fuse structure 230. The first to third contact holes 241, 242, and 243 may be sequentially formed in the first direction x, in the order of the first contact hole 241, third contact hole 243, and the second contact hole 242, respectively. In other words, the third contact hole 243 may be formed between the first and second contact holes 241 and 242. In this way, the first and second contact holes 241 and 242 can expose both ends of the fuse structure 220, and the third contact hole 243 can expose a center portion of the fuse structure 220. From a second direction y, the width of the third contact hole 243 (WH) may be larger than the width of the fuse structure 220 (WF).

The step of forming the third contact hole 243 may include the step of etching the interlayer dielectric 230 and the step of etching the fuse structure 220. The metal semiconductor compound layer 222 may be patterned and the semiconductor layer 221 may be exposed by etching the fuse structure 220. Thus the metal semiconductor compound layer 222 may be divided into two portions by the third contact hole 243.

The first to third contact holes 241, 242 and 243 may be formed simultaneously or sequentially. For example, the third contact hole may be formed after the first and second contact holes 241 and 242 are formed. In the case where the first to third contact holes 241, 242 and 243 are formed simultaneously, the metal semiconductor compound layer 122 is patterned also at the first and the second contact holes 141 and 142, so that the semiconductor layer 221 is exposed. In the case where the first to third contact holes 241, 242 and 243 are formed sequentially, a separate mask may be used for etching the fuse structure 220 to make the third contact hole 243.

Figure 8:
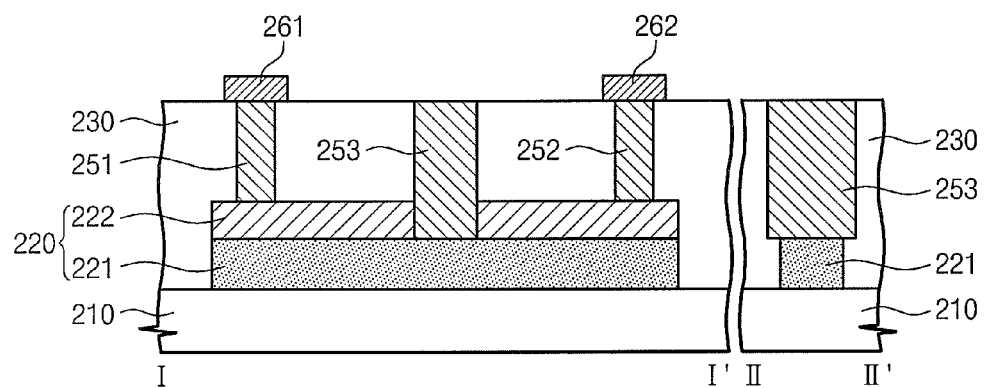

Referring to FIG. 5 and FIG. 8, a first contact plug 251, a second contact plug 252, and a dummy contact plug 253 are formed in the first to third contact holes 241, 242 and 243, respectively, to be connected to the fuse structure 220. The dummy contact plug 253 is formed between the first and the second contact plugs 251 and 252. In other words, the first and the second contact plugs 251 and 252 are disposed at both ends of the fuse structure 220, and the dummy contact plug 253 is disposed at the center portion of the fuse structure 220.

The first and the second contact plugs 251 and 252 and the dummy contact plug 253 may be formed simultaneously. For example, the first and the second contact plugs 251 and 252 and the dummy contact plug 253 may be formed by forming a conductive layer on the interlayer dielectric 230 including the first to third contact holes 241, 242 and 243 and then performing a planarization process to expose a top surface of the interlayer dielectric 230. For example, the first and the second contact plugs 251 and 252 and the dummy contact plug 253 may include tungsten. Alternatively, a barrier metal layer may be further formed along an internal surface of the first to third contact holes 241, 242 and 243, before the first and the second contact plugs 251 and 252 and the dummy contact plug 253 are formed. For example, the barrier metal layer may include Ti and/or TiN. In the second direction y, the thickness of the width WP of the dummy contact plug 253 may be larger than the width WF of the fuse structure 220.

The bottom surface of the dummy contact plug 253 is in contact with a top surface of the semiconductor layer 221 of the fuse structure. And lower sidewalls of the dummy contact plug 253 are in contact with sidewalls of the divided metal semiconductor compound layer 222.

A first and a second conductive patterns 261 and 262 are formed which are connected to the first and second contact plugs 251 and 252 on the interlayer dielectric 230, respectively. The first and second conductive patterns 261 and 262 may be metal lines or metal pads.

When an electrical signal is supplied to the first conductive pattern 261 and/or second conductive pattern 262, electrical current flows through the first and second conductive patterns 261 and 262. Electrons are transferred in the opposite direction to the electric current flow. For example, when a first signal voltage is supplied to the first conductive pattern 261, and a second signal voltage higher than the first signal voltage is supplied to the second conductive pattern 262, the current flows in the direction and path of: the second conductive pattern 262→second contact plug 252→the metal semiconductor compound of the fuse structure 222→dummy contact plug 253→the metal semiconductor compound of the fuse structure 222→first contact plug 251→first conductive pattern 261. Electrons are transferred in the opposite direction of the current flow, which is in the direction and path of: first conductive pattern 261→first contact plug 251→the metal semiconductor compound of the fuse structure 222→dummy contact plug 253→the metal semiconductor compound of the fuse structure 222→second contact plug 252→the second conductive pattern 262. Among the area of the metal semiconductor compound layer 222 in contact with the dummy contact plug 253, at an area near the second conductive pattern 262 (or the second contact plug 252) in which the higher signal voltage is supplied, the electromigration corresponding to the current flow may be increased, thereby enabling the metal semiconductor compound layer 222 to be cut off more rapidly.

Referring to FIGS. 9 to 12, another semiconductor device and method of forming the same will be described according to a third exemplary embodiment of the present invention.

Figure 9:
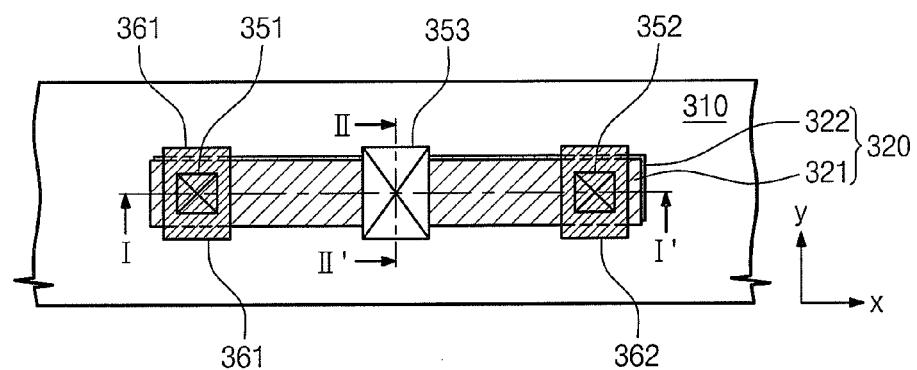
FIG. 9 is a plan view illustrating a semiconductor device and a method of forming the same according to an exemplary embodiment of the present invention.
Figure 10:
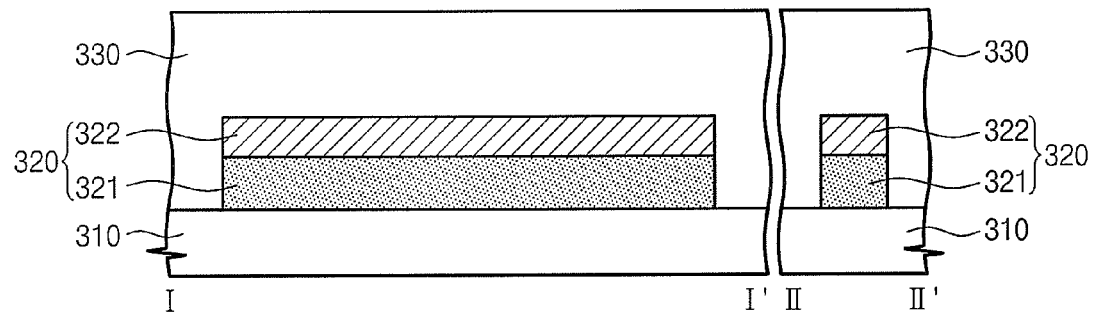
FIGS. 10 to 12 are cross-sectional views cut along line I-I' and line II-II' of FIG. 9.

Referring to FIG. 9 and FIG. 10, a fuse structure 320 is formed in a substrate 310. The fuse structure 320 may be formed on an insulation layer formed in the substrate 310, and may be elongated to a first direction x. The fuse structure 320 may include a lower semiconductor layer 321 and an upper metal semiconductor compound layer 322. In other words, the fuse structure 320 may be formed by stacking a respective semiconductor layer 321 and a metal semiconductor compound layer 322. For example, the semiconductor layer 321 may include polysilicon, and the metal semiconductor compound layer 322 may include a metal silicide. The metal silicide may be made by, for example, forming a metal layer on the polysilicon then performing an annealing process. The metal silicide may include, for example, cobalt silicide and/or nickel silicide. An interlayer dielectric 330 which includes the fuse structure 320 is formed in the substrate 310. For example, the interlayer dielectric 330 may include a silicon oxide material obtained by a chemical vapor deposition (CVD) process.

Figure 11:
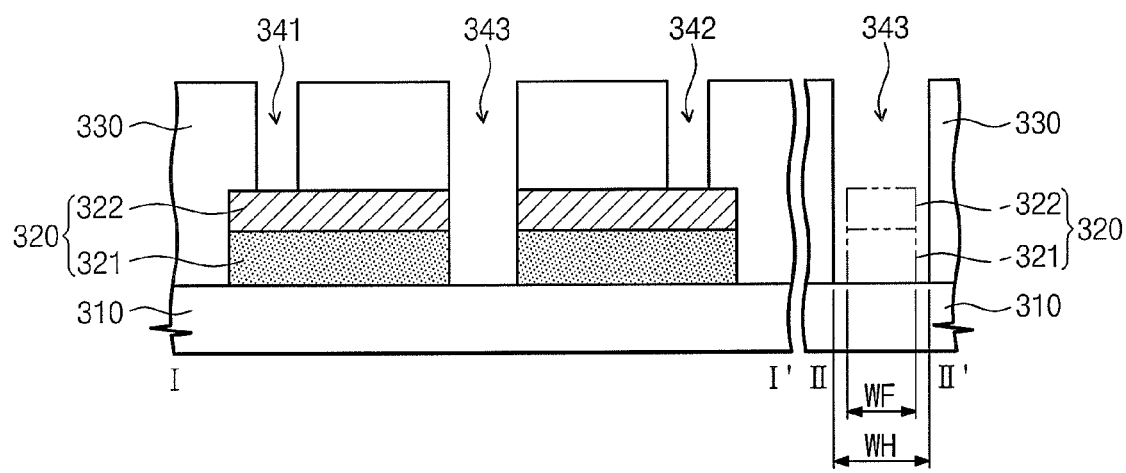

Referring to FIG. 9 and FIG. 11, the interlayer dielectric 330 is etched to form a first, second, and third contact holes 341, 342, and 343 so that they expose the fuse structure 330. The first to third contact holes 341, 342, and 343 may be sequentially formed in the first direction x, in the order of the first contact hole 341, third contact hole 343, and the second contact hole 342, respectively. In other words, the third contact hole 343 may be formed between the first and second contact holes 341 and 342. In this way, the first and second contact holes 341 and 342 can expose both ends of the fuse structure 320, and the third contact hole 343 can expose a center portion of the fuse structure 320. From the second direction y, the width of the third contact hole 343 (WH) may be larger than the width of the fuse structure 320 (WF).

The step of forming the third contact hole 343 may include the step of etching the interlayer dielectric 330 and the step of etching the fuse structure 320. The metal semiconductor compound layer 322 and the semiconductor layer 321 may be patterned and the substrate 310 may be exposed by etching the fuse structure 320. Thus, the fuse structure 320 may be divided into two portions by the third contact hole 343.

Figure 12:
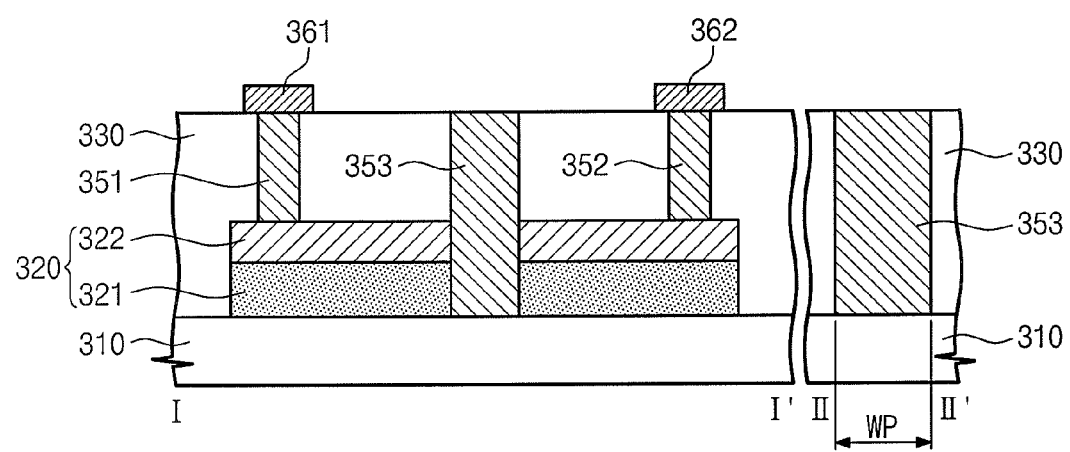

Referring to FIG. 9 and FIG. 12, a first contact plug 351, a second contact plug 352, and a dummy contact plug 353 are formed in the first to third contact holes 341, 342 and 343, respectively, to be connected to the fuse structure 320. The dummy contact plug 353 is formed between the first and the second contact plugs 351 and 352. In other words, the first and the second contact plugs 351 and 352 are disposed at both ends of the fuse structure 320, and the dummy contact plug 353 is disposed at the center portion of the fuse structure 320.

The first and the second contact plugs 351 and 352 and the dummy contact plug 353 may be formed simultaneously. For example, the first and the second contact plugs 351 and 352 and the dummy contact plug 353 may be formed by forming a conductive layer on the interlayer dielectric 330 including the first to third contact holes 341, 342 and 343 and then performing a planarization process to expose a top surface of the interlayer dielectric 330. For example, the first and the second contact plugs 351 and 352 and the dummy contact plug 353 may include tungsten. Alternatively, a barrier metal layer may be further formed along an internal surface of the first to third contact holes 341, 342 and 343, before the first and the second contact plugs 351 and 352 and the dummy contact plug 353 are formed. For example, the barrier metal layer may include Ti and/or TiN. In the second direction y, the thickness of the width WP of the dummy contact plug 353 may be larger than the width WF of the fuse structure 320.

The bottom surface of the dummy contact plug 353 is in contact with a top surface of the substrate 310. And lower sidewalls of the dummy contact plug 353 are in contact with sidewalls of the divided fuse structure 320.

A first and a second conductive patterns 361 and 362 are formed and are connected to the first and second contact plugs 351 and 352 on the interlayer dielectric 330, respectively. The first and second conductive patterns 361 and 362 may be metal lines or metal pads.

When an electrical signal is supplied to the first conductive pattern 361 and/or second conductive pattern 362, electrical current flows through the first and second conductive patterns 361 and 362. Electrons move in the opposite direction to the electric current flow. For example, when a first signal voltage is supplied to the first conductive pattern 361, and a second signal voltage higher than the first signal voltage is supplied to the second conductive pattern 362, the current flows in the direction and path of: the second conductive pattern 362→second contact plug 352→the metal semiconductor compound of the fuse structure 322→dummy contact plug 353→the metal semiconductor compound of the fuse structure 322→first contact plug 351→first conductive pattern 361. Electrons move in the opposite direction of the current flow, which is in the direction and path of: first conductive pattern 361→first contact plug 351→the metal semiconductor compound of the fuse structure 322→dummy contact plug 353→the metal semiconductor compound of the fuse structure 322→second contact plug 352→the second conductive pattern 362. Among the area of the metal semiconductor compound layer 322 in contact with the dummy contact plug 353, at an area near the second conductive pattern 362 (or the second contact plug 352) in which the higher signal voltage is supplied, the electromigration corresponding to the current flow may be increased, thereby enabling the metal semiconductor compound layer 322 to be cut off more rapidly.

Referring to FIGS. 13 to 17, another semiconductor device and method of forming the same will be described according to a fourth exemplary embodiment of the present invention.

Figure 13:
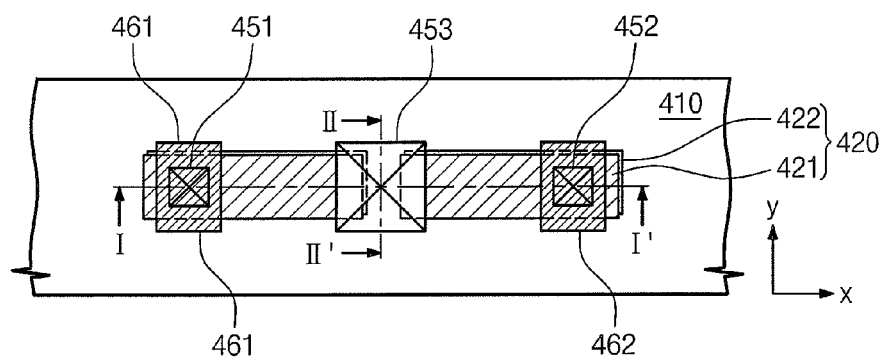
FIG. 13 is a plan view illustrating a semiconductor device and a method of forming the same according to an exemplary embodiment of the present invention.
Figure 14:
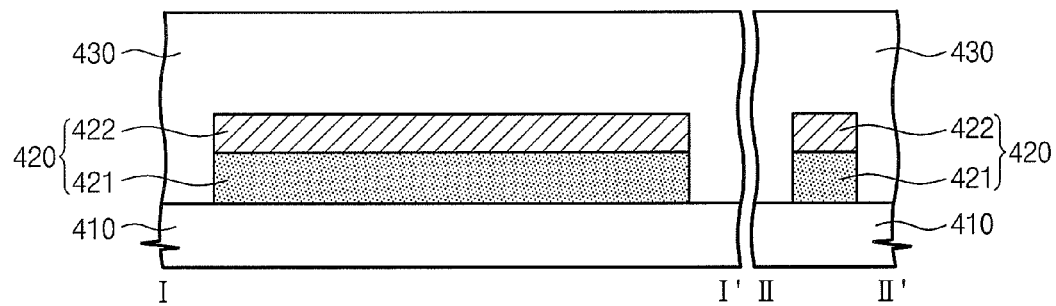
FIGS. 14 to 17 are cross-sectional views cut along line I-I' and line II-II' of FIG. 13.

Referring to FIG. 13 and FIG. 14, a fuse structure 420 is formed in a substrate 410. The fuse structure 420 may be formed on an insulation layer formed in the substrate 410, and may be elongated to the first direction x. The fuse structure 420 may include a lower semiconductor layer 421 and an upper metal semiconductor compound layer 422. In other words, the fuse structure 420 may be formed by stacking a respective semiconductor layer 421 and a metal semiconductor compound layer 422. For example, the semiconductor layer 421 may include polysilicon, and the metal semiconductor compound layer 422 may include a metal silicide. The metal silicide may be made by, for example, forming a metal layer on the polysilicon then performing an annealing process. The metal silicide may include, for example, cobalt silicide and/or nickel silicide. An interlayer dielectric 430 which includes the fuse structure 420 is formed in the substrate 410. For example, the interlayer dielectric 430 may include a silicon oxide material obtained by a chemical vapor deposition (CVD) process.

Figure 15:
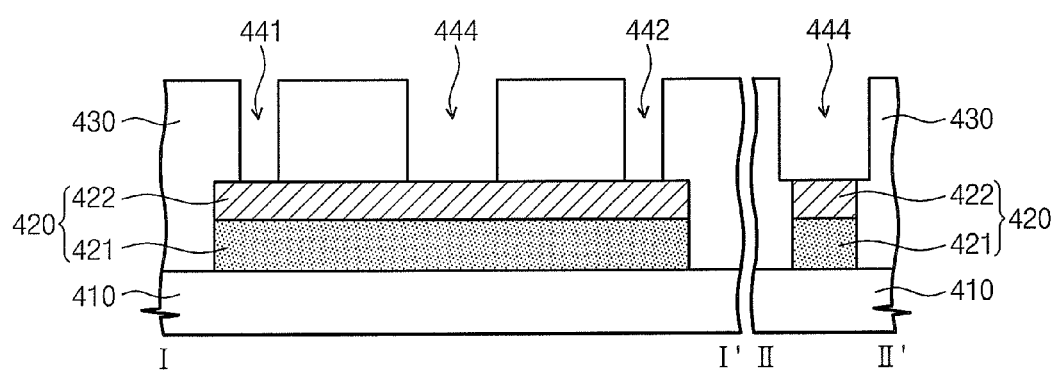

Referring to FIG. 13 and FIG. 15, the interlayer dielectric 430 is etched to form a first and second contact holes 441 and 442 and a first area 444 of a third contact hole so that they expose a fuse compound layer 422. The first and second contact holes 341 and 342 and the first area 444 of the third contact hole may be formed simultaneously.

Figure 16:
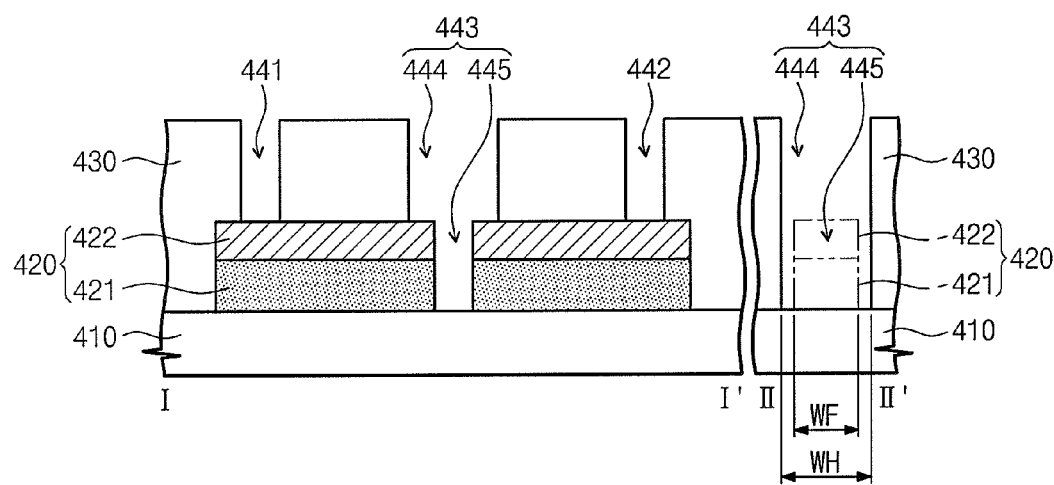
Figure 17:
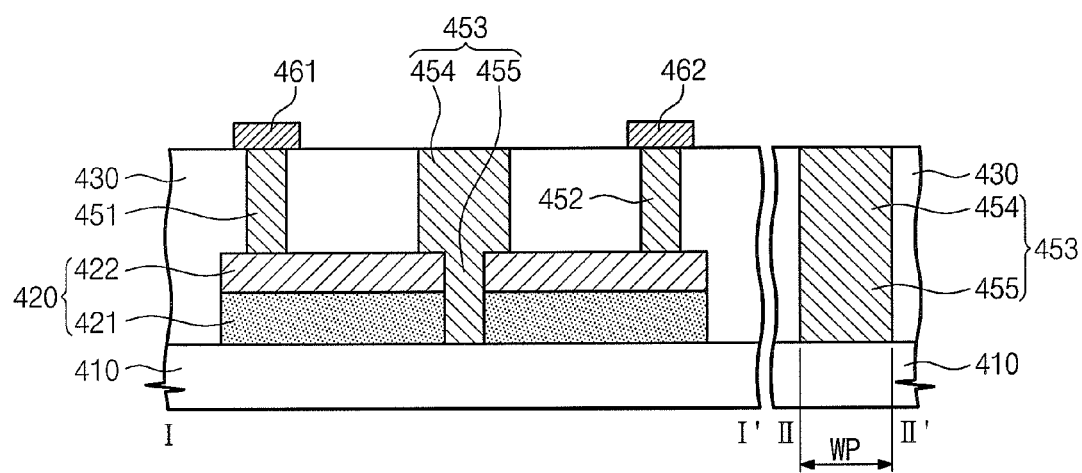

Referring to FIG. 13 and FIG. 16, the fuse structure 420 is etched to form a second area 445 of the third contact hole so that it exposes the substrate 410. In other words, the step of forming the third contact hole 443 may include the step of etching the interlayer dielectric 430 and the step of etching the fuse structure 420 to form the second area 445. Thus, the fuse structure 420 may be divided into two portions by the second area 445 of the third contact hole. In the second direction y, the width of the first area 444 may be larger than the width of the second area 445.

The first to third contact holes 441, 442, and 443 may be sequentially formed in the first direction x, in the order of the first contact hole 441, third contact hole 443, and the second contact hole 442, respectively. In other words, the third contact hole 443 may be formed between the first and second contact holes 441 and 442. In this way, the first and second contact holes 441 and 442 are formed at both ends of the fuse structure 420, and the dummy contact plug 453 is formed at the center portion of the fuse structure 420.

The first and the second contact plugs 451 and 452 and the dummy contact plug 453 may be formed simultaneously. For example, the first and the second contact plugs 451 and 452 and the dummy contact plug 453 may be formed by forming a conductive layer on the interlayer dielectric 430 including the first to third contact holes 441, 442 and 443 and then performing a planarization process to expose a top surface of the interlayer dielectric 430. For example, the first and the second contact plugs 451 and 452 and the dummy contact plug 453 may include tungsten. Alternatively, a barrier metal layer may be further formed along an internal surface of the first to third contact holes 441, 442 and 443, before the first and the second contact plugs 451 and 452 and the dummy contact plug 453 are formed. For example, the barrier metal layer may include Ti and/or TiN. In the second direction y, the thickness of the width WP of the dummy contact plug 453 may be larger than the width WF of the fuse structure 420.

The top surface of the dummy contact plug 453 includes an upper first portion 454 and a lower second portion 455. The width of the first portion 454 may be larger than the width of the second portion 455. The bottom surface of the second portion 455 of the dummy contact plug is in contact with a top surface of the substrate 410, and sidewalls of the second portion 455 are in contact with sidewalls of the divided fuse structure 420.

A first and a second conductive patterns 461 and 462 are formed and are connected to the first and second contact plugs 451 and 452 on the interlayer dielectric 430, respectively. The first and second conductive patterns 461 and 462 may be metal lines or metal pads.

When an electrical signal is supplied to the first conductive pattern 461 and/or second conductive pattern 462, electrical current flows through the first and second conductive patterns 461 and 462. Electrons move in the opposite direction to the electric current flow. For example, when a first signal voltage is supplied to the first conductive pattern 461, and a second signal voltage higher than the first signal voltage is supplied to the second conductive pattern 462, the current flows in the direction and path of: the second conductive pattern 462→second contact plug 452→the metal semiconductor compound of the fuse structure 422→second portion 455 of the dummy contact plug→the metal semiconductor compound of the fuse structure 422→first contact plug 451→first conductive pattern 461. Electrons move in the opposite direction of the current flow, which is in the direction and path of: first conductive pattern 461→first contact plug 451→the metal semiconductor compound of the fuse structure 422→second portion 455 of the dummy contact plug→the metal semiconductor compound of the fuse structure 422→second contact plug 452→the second conductive pattern 462. Among the area of the metal semiconductor compound layer 422 in contact with the dummy contact plug 453, at an area near the second conductive pattern 462 (or the second contact plug 452) in which the higher signal voltage is supplied, the electromigration corresponding to the current flow may be increased, thereby enabling the metal semiconductor compound layer 422 to be cut off more rapidly.

Referring to FIGS. 18 to 21, another semiconductor device and method of forming the same will be described according to a fifth exemplary embodiment of the present invention.

Figure 18:
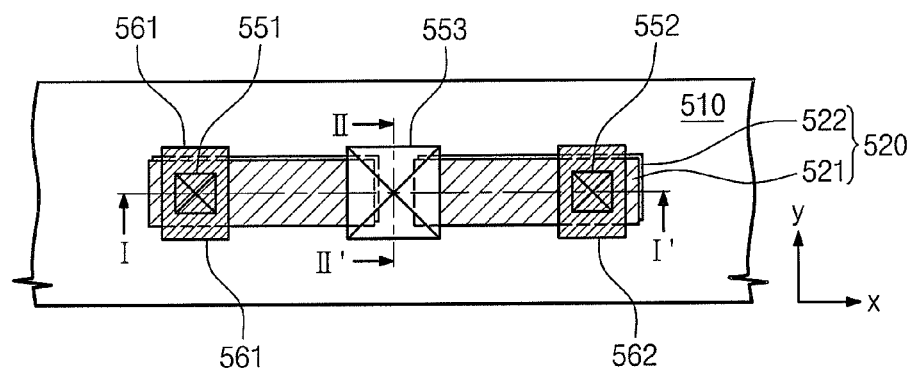
FIG. 18 is a plan view illustrating a semiconductor device and a method of forming the same according to an exemplary embodiment of the present invention.
Figure 19:
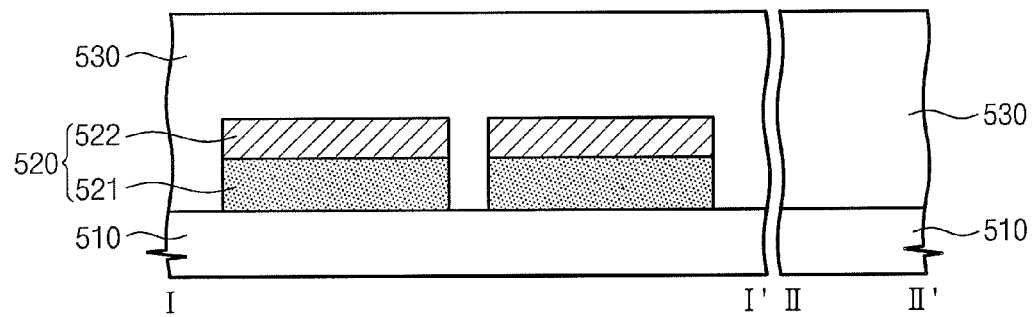
FIGS. 19 to 21 are cross-sectional views cut along line I-I' and line II-II' of FIG. 18.

Referring to FIG. 18 and FIG. 19, a fuse structure 520 is formed in a substrate 510. The fuse structure 520 may be formed on an insulation layer formed in the substrate 510, and may be elongated to the first direction x and may be divided into two portions spaced from each other. The fuse structure 520 may include a lower semiconductor layer 521 and an upper metal semiconductor compound layer 522. In other words, the fuse structure 520 may be formed by stacking a respective semiconductor layer 521 and a metal semiconductor compound layer 522. For example, the semiconductor layer 521 may include polysilicon, and the metal semiconductor compound layer 522 may include a metal silicide. The metal silicide may be made by, for example, forming a metal layer on the polysilicon then performing an annealing process. The metal silicide may include, for example, cobalt silicide and/or nickel silicide. An interlayer dielectric 530 which includes the fuse structure 520 is formed in the substrate 510. For example, the interlayer dielectric 530 may include a silicon oxide material obtained by a chemical vapor deposition (CVD) process. The interlayer dielectric 530 is interposed between the divided two portions of the fuse structure 520.

Figure 20:
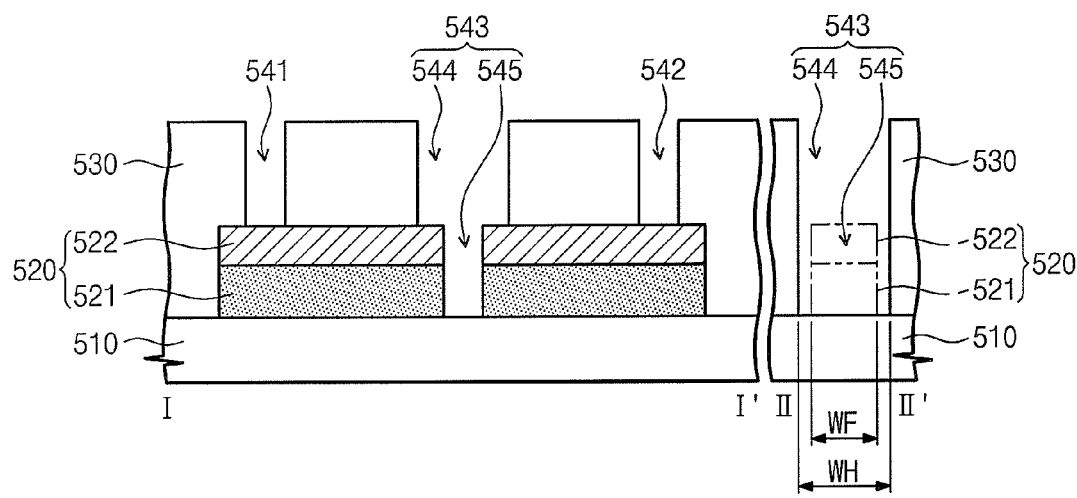

Referring to FIG. 18 and FIG. 20, the interlayer dielectric 530 is etched to form a first, second, and third contact holes 541, 542, and 543 so that they expose the fuse structure 530. The first to third contact holes 541, 542, and 543 may be sequentially formed in the first direction x, in the order of the first contact hole 541, third contact hole 543, and the second contact hole 542, respectively. In other words, the third contact hole 543 may be formed between the first and second contact holes 541 and 542. In this way, the first and second contact holes 541 and 542 can expose both ends of the fuse structure 520, and the third contact hole 543 can expose the center portion of the fuse structure 520. From the second direction y, the width of the third contact hole 343 (WH), between the divided two portions of the fuse structure 520, may be larger than the width of the fuse structure 520 (WF).

The third contact hole 543 may include an upper first portion 554 and a lower second portion 555. In the first direction x, the width of the first portion 554 may be larger than the width of the second portion 555. The first and second contact holes 541 and 542 and the first portion of the third contact hole may be formed simultaneously. The interlayer dielectric 530 disposed between the divided two portions of the fuse structure 520 may be etched to form the second area 555. The top surface of the substrate 510 may be exposed by the second area 555. However, the interlayer dielectric 530 between the divided two portions of the fuse structure 520 may be left to remain and not expose the top surface of the substrate 510.

In the etch process, the metal semiconductor compound layer 522 may function as an etch stop layer, and when the second portion 545 is formed, the metal semiconductor compound layer 522 in the lower portions of the first and second contact holes 541 and 542 may not be etched. In other words, an etch condition may be used, in which the interlayer dielectric 530 may be selectively etched against the metal semiconductor compound layer 522. Accordingly, the first to third contact holes 541, 542, and 543 may be formed simultaneously in essence, in a single etch process.

Figure 21:
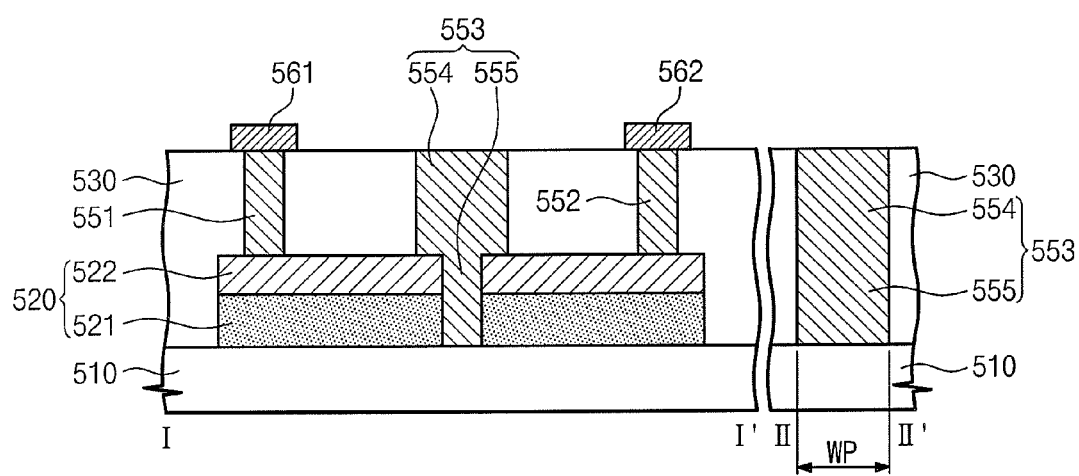

Referring to FIG. 18 and FIG. 21, a first contact plug 551, a second contact plug 552, and a dummy contact plug 553 are formed in the first to third contact holes 541, 542 and 543, respectively, to be connected to the fuse structure 520. The dummy contact plug 553 is formed between the first and the second contact plugs 551 and 552. In other words, the first and the second contact plugs 551 and 552 are disposed at both ends of the fuse structure 520, and the dummy contact plug 553 is disposed at the center portion of the fuse structure 520.

The first and the second contact plugs 551 and 552 and the dummy contact plug 553 may be formed simultaneously. For example, the first and the second contact plugs 551 and 552 and the dummy contact plug 553 may be formed by forming a conductive layer on the interlayer dielectric 530 including the first to third contact holes 541, 542 and 543 and then performing a planarization process to expose the top surface of the interlayer dielectric 530. For example, the first and the second contact plugs 551 and 552 and the dummy contact plug 553 may include tungsten. Alternatively, a barrier metal layer may be further formed along an internal surface of the first to third contact holes 541, 542 and 543, before the first and the second contact plugs 551 and 552 and the dummy contact plug 553 are formed. For example, the barrier metal layer may include Ti and/or TiN. In the second direction y, the thickness of the width WP of the dummy contact plug 553 may be larger than the width WF of the fuse structure 520.

The top surface of the dummy contact plug 553 includes an upper first portion 554 and a lower second portion 555. The width of the first portion 554 in the first direction x may be larger than the width of the second portion 555. The bottom surface of the second portion 555 of the dummy contact plug is in contact with the top surface of the substrate 510, and sidewalls of the second portion 555 are patterned and may be in contact with sidewalls of the divided semiconductor layer 521 and sidewalls of the metal semiconductor compound layer 522.

A first and a second conductive patterns 561 and 562 are formed which are connected to the first and second contact plugs 551 and 552 on the interlayer dielectric 530, respectively. The first and second conductive patterns 561 and 562 may be metal lines or metal pads.

When an electrical signal is supplied to the first conductive pattern 561 and/or second conductive pattern 562, electrical current flows through the first and second conductive patterns 561 and 562. Electrons move in the opposite direction to the electric current flow. For example, when a first signal voltage is supplied to the first conductive pattern 561, and a second signal voltage higher than the first signal voltage is supplied to the second conductive pattern 562, the current flows in the direction and path of: the second conductive pattern 562→second contact plug 552→the metal semiconductor compound of the fuse structure 522→second portion 555 of the dummy contact plug→the metal semiconductor compound of the fuse structure 522→first contact plug 551→first conductive pattern 561. Electrons move in the opposite direction of the current flow, which is in a direction path of: first conductive pattern 561→first contact plug 551→the metal semiconductor compound of the fuse structure 522→second portion 555 of the dummy contact plug→the metal semiconductor compound of the fuse structure 522→second contact plug 552→the second conductive pattern 562. Among the area of the metal semiconductor compound layer 522 in contact with the dummy contact plug 553, at an area near the second conductive pattern 562 (or the second contact plug 552) in which the higher signal voltage is supplied, the electromigration corresponding to the current flow may be increased, thereby enabling the metal semiconductor compound layer 522 to be cut off more rapidly. For example, the metal semiconductor compound layer 522 can be cut off more rapidly in an area where the cross-sectional area of the metal semiconductor compound layer 522 is decreased.

Referring to FIGS. 22 to 26, another semiconductor device and method of forming the same will be described according to a sixth exemplary embodiment of the present invention.

Figure 22:
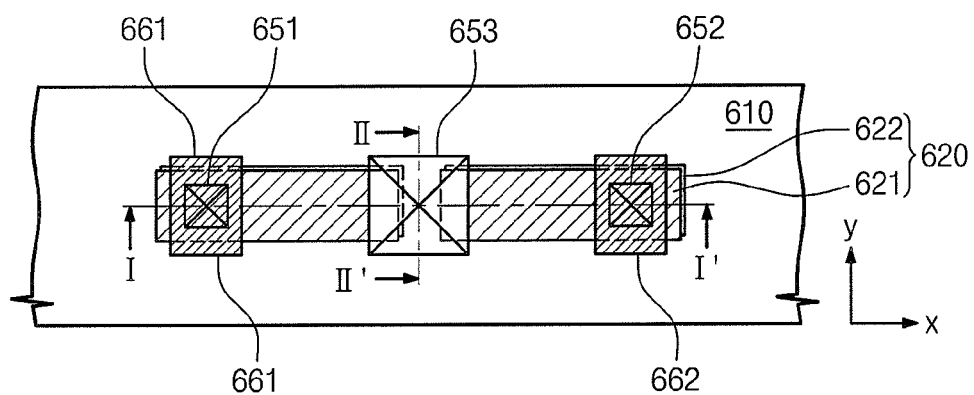
FIG. 22 is a plan view illustrating a semiconductor device and a method of forming the same according to an exemplary embodiment of the present invention.
Figure 23:
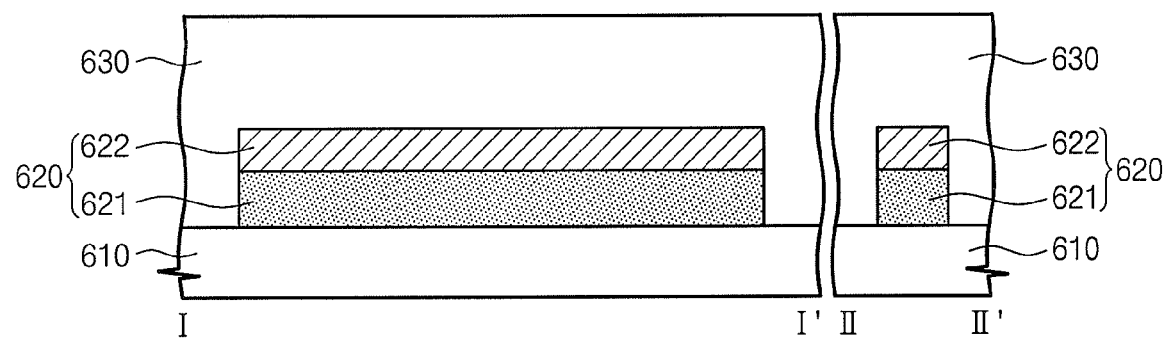
FIGS. 23 to 26 are cross-sectional views cut along line I-I' and line II-II' of FIG. 22.

Referring to FIG. 22 and FIG. 23, a fuse structure 620 is formed in a substrate 610. The fuse structure 620 may be formed on an insulation layer formed in the substrate 610, and may be elongated to the first direction x. The fuse structure 620 may include a lower semiconductor layer 621 and an upper metal semiconductor compound layer 622. In other words, the fuse structure 620 may be formed by stacking a respective semiconductor layer 621 and a metal semiconductor compound layer 622. For example, the semiconductor layer 621 may include polysilicon, and the metal semiconductor compound layer 622 may include a metal silicide. The metal silicide may be made by, for example, forming a metal layer on the polysilicon then performing an annealing process. The metal silicide may include, for example, cobalt silicide and/or nickel silicide. An interlayer dielectric 630 which includes the fuse structure 620 is formed in the substrate 610. For example, the interlayer dielectric 630 may include a silicon oxide material obtained by a chemical vapor deposition (CVD) process.

Figure 24:
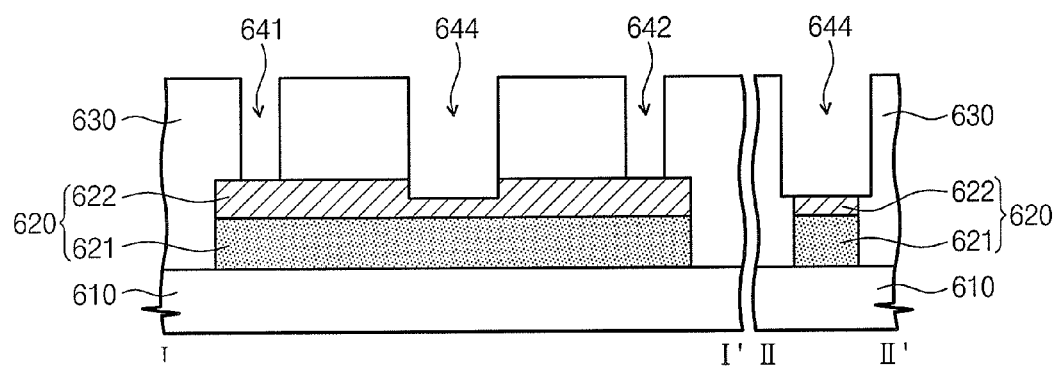

Referring to FIG. 22 and FIG. 24, the interlayer dielectric 630 is etched to form a first and a second contact hole 641 and 642 and a first area 644 of a third contact hole so that they expose a fuse structure 630. The first and second contact holes 641 and 642 and the first area 644 of the third contact hole may be formed simultaneously or sequentially. For example, the first area 644 of the third contact hole may be formed after the first and second contact holes 641 and 642 are formed. The step of forming the first area 644 of the third contact hole may include the step of etching the interlayer dielectric 630 and the step of etching the metal semiconductor compound layer 622. Equivalent etching conditions (e.g. etch gas) or different etching conditions may be used for etching the interlayer dielectric 630 and etching the metal semiconductor compound layer 622. Also, the etching of metal semiconductor compound layer 622 may be done by over-etching the interlayer dielectric 630. As a result, a portion of metal semiconductor compound layer 622 is recessed, and the bottom surface of the first area 644 of the third contact hole comes at a deeper level than the top surface of metal semiconductor compound layer 622. For example, the bottom surface of the first area 644 of the third contact hole may be at a level between the bottom surface and the top surface of the metal semiconductor compound layer 622.

Figure 25:
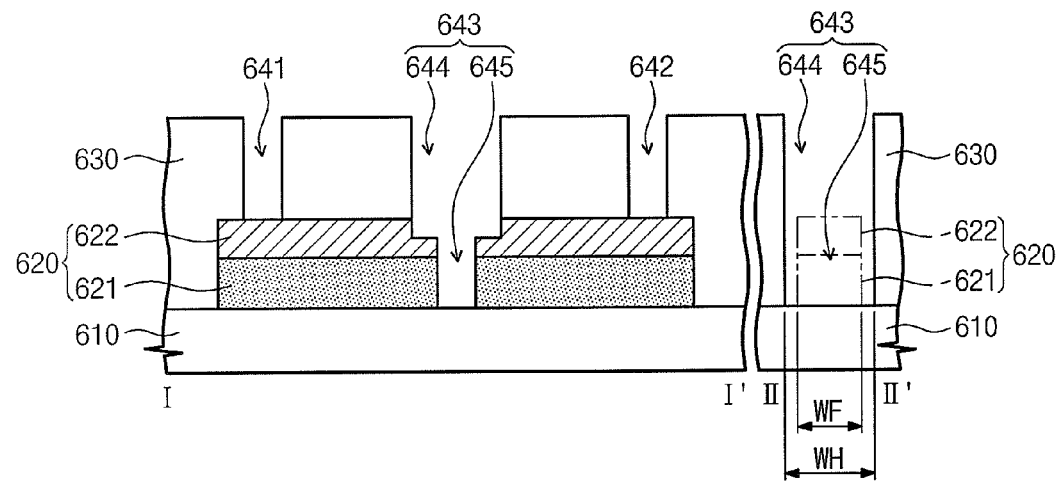

Referring to FIG. 22 and FIG. 25, the fuse structure 620 is etched to form a second area 645 of the third contact hole so that it exposes the substrate 610. In other words, the step of forming the third contact hole 643 may include the step of etching a portion of the interlayer dielectric 630 and a portion of the metal semiconductor compound layer 622 to form the first area 644, and include the step of etching the fuse structure 620 to form a second area 645. The fuse structure 20 may be divided into two portions by the third contact hole 643. In the first direction x, the width of the first area 644 may be larger than the width of the second area 645.

The first to third contact holes 641, 642, and 643 are arrayed in the first direction x, in the order of the first contact hole 641, the third contact hole 643 and the second contact hole 642, respectively. In other words, the third contact hole 643 may be formed between the first contact hole 641 and the second contact hole 642. In this way, the first and second contact holes 641 and 642 can expose both ends of the fuse structure 620, and the third contact hole 643 can expose a center portion of the fuse structure 620. From the second direction y, the width of the third contact hole 643 (WH) may be larger than the width of the fuse structure 620 (WF).

Figure 26:
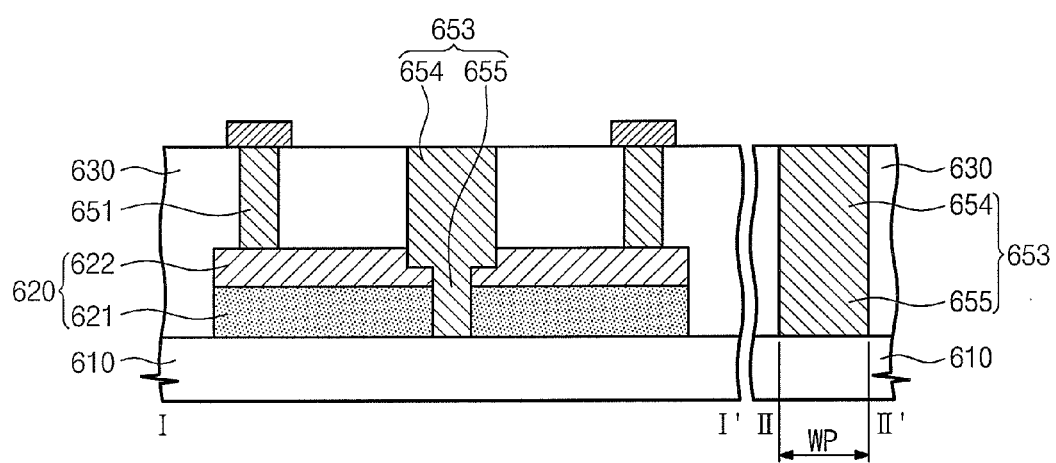

Referring to FIG. 22 and FIG. 26, a first contact plug 651, a second contact plug 652, and a dummy contact plug 653 are formed in the first to third contact holes 641, 642 and 643, respectively, to be connected to the fuse structure 620. The dummy contact plug 653 is formed between the first and the second contact plugs 651 and 652. In other words, the first and the second contact plugs 651 and 652 are disposed at both ends of the fuse structure 620, and the dummy contact plug 653 is disposed at the center portion of the fuse structure 620.

The first and the second contact plugs 651 and 652 and the dummy contact plug 653 may be formed simultaneously. For example, the first and the second contact plugs 651 and 652 and the dummy contact plug 653 may be formed by forming a conductive layer on the interlayer dielectric 630 including the first to third contact holes 641, 642 and 643 and then performing a planarization process to expose a top surface of the interlayer dielectric 630. For example, the first and the second contact plugs 651 and 652 and the dummy contact plug 653 may include tungsten. Alternatively, a barrier metal layer may be further formed along an internal surface of the first to third contact holes 641, 642 and 643, before the first and the second contact plugs 651 and 652 and the dummy contact plug 653 are formed. For example, the barrier metal layer may include Ti and/or TiN. In the second direction y, the thickness of the width WP of the dummy contact plug 653 may be larger than the width WF of the fuse structure 620.

The dummy contact plug 653 may include an upper first portion 654 and a lower second portion 655. In the first direction x, the width of the first portion 654 may be larger than the width of the second portion 655. The bottom surface of the second portion 655 of the dummy contact plug may be in contact with the top surface of the substrate 610, and sidewalls of the second portion 655 may be patterned to be in contact with sidewalls of the divided semiconductor layer 621 and bottom sidewalls of the metal semiconductor compound layer 622.

A first and a second conductive patterns 661 and 662 are formed and are connected to the first and second contact plugs 651 and 652 on the interlayer dielectric 630, respectively. The first and second conductive patterns 661 and 662 may be metal lines or metal pads.

When an electrical signal is supplied to the first conductive pattern 661 and/or second conductive pattern 662, electrical current flows through the first and second conductive patterns 661 and 662. Electrons move in the opposite direction to the electric current flow. For example, when a first signal voltage is supplied to the first conductive pattern 661, and a second signal voltage higher than the first signal voltage is supplied to the second conductive pattern 662, the current flows in the direction and path of: the second conductive pattern 662→second contact plug 652→the metal semiconductor compound of the fuse structure 622→second portion 655 of the dummy contact plug→the metal semiconductor compound of the fuse structure 622→first contact plug 651→first conductive pattern 661. Electrons move in the opposite direction of the current flow, which is in a direction and path of: first conductive pattern 661→first contact plug 651→the metal semiconductor compound of the fuse structure 622→second portion 655 of the dummy contact plug→the metal semiconductor compound of the fuse structure 622→second contact plug 652→the second conductive pattern 662. Among the area of the metal semiconductor compound layer 622 in contact with the dummy contact plug 653, at an area near the second conductive pattern 662 (or the second contact plug 652) in which the higher signal voltage is supplied, the electromigration corresponding to the current flow may be increased, thereby enabling the metal semiconductor compound layer 622 to be cut off more rapidly. For example, the metal semiconductor compound layer 622 can be cut off more rapidly in an area where the cross-sectional area of the metal semiconductor compound layer 622 is decreased.

According to exemplary embodiments of the present invention, the dummy contact plug may be formed without an additional process, as it can be formed simultaneously with other contact plugs.

As described in the exemplary embodiments of the present invention, a fuse structure may be cut off rapidly and effectively, as electromigration may be increased in the area in contact with or in the vicinity of the dummy contact plug.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
    a fuse structure disposed on a substrate;
    an interlayer dielectric disposed on the fuse structure;
    a first contact plug, a second contact plug, and a dummy contact plug penetrating the interlayer dielectric and wherein each of the first contact plug, the second contact plug and the dummy contact plug are connected to the fuse structure; and
    a first conductive pattern and a second conductive pattern disposed on the interlayer dielectric to expose a top surface of the dummy contact plug, the first conductive pattern and the second conductive pattern being electrically connected to the first contact plug and the second contact plug, respectively.

2. The semiconductor device as claimed in claim 1, wherein the dummy contact plug is disposed between the first contact plug and the second contact plug.

3. The semiconductor device as claimed in claim 1, wherein the fuse structure has a smaller thickness at a portion in contact with a bottom surface of the dummy contact plug.

4. The semiconductor device as claimed in claim 1, wherein the dummy contact plug penetrates the fuse structure.

5. The semiconductor device as claimed in claim 1, wherein a width of the dummy contact plug is larger than a width of the fuse structure.

6. The semiconductor device as claimed in claim 1, wherein the fuse structure comprises a lower semiconductor layer and an upper metal semiconductor compound layer.

7. The semiconductor device as claimed in claim 6, wherein a bottom surface of the dummy contact plug is at a level between a bottom surface and a top surface of the upper metal semiconductor compound layer.

8. The semiconductor device as claimed in claim 6, wherein the dummy contact plug penetrates the upper metal semiconductor compound layer.

9. The semiconductor device as claimed in claim 6, wherein the dummy contact plug comprises an upper first portion and a lower second portion, and a width of the upper first portion is larger than a width of the lower second portion.

10. The semiconductor device as claimed in claim 9, wherein the lower second portion penetrates the lower semiconductor layer.

11. The semiconductor device as claimed in claim 9, wherein a boundary surface of the upper first portion and lower second portion is at a level between a bottom surface and a top surface of the upper metal semiconductor compound layer.

12. The semiconductor device as claimed in claim 1, wherein a bottom surface of the dummy contact plug is at a lower level than a top surface of the fuse structure.

13. The semiconductor device as claimed in claim 1, wherein the first and second contact plugs are disposed on opposite ends of the fuse structure and the dummy contact plug is disposed on a center portion of the fuse structure between the first and second contact plugs.

14. The semiconductor device as claimed in claim 1, wherein the first and second contact plugs and the dummy contact plug are each formed of a same material.

15. The semiconductor device as claimed in claim 14, wherein the first and second contact plugs and the dummy contact plug are each formed of tungsten.

16. A semiconductor device comprising:
a fuse structure disposed on a substrate;
an interlayer dielectric disposed on the fuse structure;
a first contact plug, a second contact plug, and a dummy contact plug penetrating the interlayer dielectric, wherein each of the first contact plug, the second contact plug and the dummy contact plug are connected to the fuse structure, wherein the dummy contact plug is disposed between the first contact plug and the second contact plug, wherein a bottom surface of the dummy contact plug is at a lower level than a top surface of the fuse structure and the fuse structure has a smaller thickness at a portion in contact with the bottom surface of the dummy contact plug and wherein a width of the dummy contact plug is larger than a width of the fuse structure; and
a first conductive pattern and a second conductive pattern disposed on the interlayer dielectric, the first conductive pattern and the second conductive pattern being electrically connected to the first contact plug and the second contact plug, respectively.

17. The semiconductor device as claimed in claim 16, wherein the first and second contact plugs are disposed on opposite ends of the fuse structure and the dummy contact plug is disposed on a center portion of the fuse structure between the first and second contact plugs.

18. The semiconductor device as claimed in claim 16, wherein the fuse structure comprises a lower semiconductor layer and an upper metal semiconductor compound layer.

19. The semiconductor device as claimed in claim 18, wherein the bottom surface of the dummy contact plug is at a level between a bottom surface and a top surface of the upper metal semiconductor compound layer.

20. The semiconductor device as claimed in claim 19, wherein the upper metal semiconductor compound layer has a smaller thickness at a portion in contact with the bottom surface of the dummy contact plug.

21. The semiconductor device as claimed in claim 1, wherein electrical current flows through the fuse structure, the first contact plug, the second contact plug, and the dummy contact plug, when an electrical signal is supplied to the first and the second conductive patterns.

\* \* \* \* \*